(12) United States Patent
Wang et al.

(10) Patent No.: US 8,117,919 B2
(45) Date of Patent: Feb. 21, 2012

(54) MICRO-ELECTRO-MECHANICAL SYSTEM DEVICE

(75) Inventors: Chuan Wei Wang, HsinChu (TW); Sheng Ta Lee, HsinChu (TW)

(73) Assignee: Pixart Imaging Incorporation, R.O.C., Hsin-Chu (TW)

( * ) Notice: Subject to any disclaimer, the term of this patent is extended or adjusted under 35 U.S.C. 154(b) by 385 days.

(21) Appl. No.: 12/535,572

(22) Filed: Aug. 4, 2009

(65) Prior Publication Data

US 2010/0116056 A1  May 13, 2010

Related U.S. Application Data

(63) Continuation-in-part of application No. 12/270,797, filed on Nov. 13, 2008.

(51) Int. Cl.
  *H04R 19/00* (2006.01)
(52) U.S. Cl. .............................. 73/632; 367/181; 438/53

(58) Field of Classification Search ............... 73/514.32, 73/514.38, 632, 714, 724; 438/53; 361/283.4; 367/181
See application file for complete search history.

(56) References Cited

U.S. PATENT DOCUMENTS

| | | | |
|---|---|---|---|
| 6,402,968 B1 | 6/2002 | Yazdi et al. | |
| 6,712,983 B2 * | 3/2004 | Zhao et al. | 216/2 |
| 6,792,804 B2 | 9/2004 | Adams et al. | |
| 6,845,670 B1 | 1/2005 | McNeil et al. | |
| 7,138,694 B2 | 11/2006 | Nunan et al. | |
| 7,258,011 B2 | 8/2007 | Nasiri et al. | |
| 7,666,702 B2 * | 2/2010 | Li et al. | 438/52 |

* cited by examiner

*Primary Examiner* — John Chapman, Jr.
(74) *Attorney, Agent, or Firm* — Tung & Associates

(57) ABSTRACT

The present invention discloses a micro-electro-mechanical system (MEMS) device, comprising: a substrate with at least one opening; and a membrane supported on the substrate, the membrane including at least two thin segments and a thick segment connected together, wherein the two thin segments are not at the same level, and the thick segment is formed by a plurality of layers including at least two metal layers and a via layer, such that the membrane has a curve cross section.

9 Claims, 9 Drawing Sheets

MICRO-ELECTRO-MECHANICAL SYSTEM DEVICE

CROSS REFERENCE TO RELATED APPLICATIONS

This application is a continuation-in-part application of U.S. patent application Ser. No. 12/270,797, filed on Nov. 13, 2008.

BACKGROUND OF THE INVENTION

1. Field of Invention

The present invention relates to a micro-electro-mechanical system (MEMS) device, in particular an out-of-plane sensor, and a method for making the MEMS device, which are less affected by the stress caused by the manufacturing process.

2. Description of Related Art

An out-of-plane sensor senses the capacitance variation resulting from a change of the distance between two electrodes, and generates a corresponding signal. Such out-of-plane sensor may be used in, e.g., an accelerometer. Related art can be found in, e.g., U.S. Pat. Nos. 6,402,968; 6,792,804; 6,845,670; 7,138,694; and 7,258,011.

The above-mentioned prior art discloses either single-capacitor structure occupying a large area, or differential capacitor structure made by wafer bonding. The former consumes too much area, while the latter requires a complicated process that is not compatible with standard CMOS process.

U.S. Pat. Nos. 7,202,101; 7,109,038; 6,622,368; 7,049,051; and 6,936,524 disclose micro-acoustical sensors. Such sensors also require capacitors formed by a plate of a large area. Such large area is vulnerable to stress caused by the manufacturing process.

Therefore, it is desired to provide a MEMS device which can be manufactured by standard CMOS process and less affected by the stress caused by the manufacturing process.

SUMMARY OF THE INVENTION

In view of the drawback of the prior art, it is a first objective of the present invention to provide a MEMS device, which is less affected by the stress caused by the manufacturing process.

It is a second objective of the present invention to provide a method for making a MEMS device.

In accordance with the foregoing and other objectives of the present invention, and from one aspect of the present invention, the present invention discloses a MEMS device, comprising: a mass including a main body and two capacitor plates located at the two sides of the main body and connected with the main body, the two capacitor plates being at different elevation levels; an upper electrode located above one of the two capacitor plates, forming one capacitor therewith; and a lower electrode located below the other of the two capacitor plates, forming another capacitor therewith, wherein the upper and lower electrodes are misaligned with each other in a horizontal direction.

In the MEMS device, preferably, the mass further includes two outer mass parts connected respectively with the two capacitor plates at the outer side of each of the two capacitor plates.

In another aspect of the present invention, the present invention discloses an out-of-plane sensor, comprising a plurality of MEMS structure units, each of the MEMS structure unit including: a mass including a main body and two capacitor plates located at the two sides of the main body and connected with the main body, the two capacitor plates being at different elevation levels; an upper electrode located above one of the two capacitor plates, forming one capacitor therewith; and a lower electrode located below the other of the two capacitor plates, forming another capacitor therewith, wherein the upper and lower electrodes are misaligned with each other in a first horizontal direction.

In the out-of-plane sensor, preferably, the mass further includes two outer mass parts connected respectively with the two capacitor plates at the outer side of each of the two capacitor plates.

The plurality of MEMS structure units in the out-of-plane sensor may be arranged in various layouts; in one example, at least two MEMS structure units are orthogonal to each other in a horizontal plane.

In the out-of-plane sensor, preferably, a continuous length of the main body in at least one horizontal direction is less than a predetermined length limit, e.g., 60 µm-100 µm.

In another aspect of the present invention, the present invention discloses a method for making a MEMS device, comprising: providing a substrate; depositing and patterning at least a contact layer, a metal layer and a via layer, the contact layer, metal layer and via layer as a whole include a to-be-etched region therein; and removing the to-be-etched region to form a MEMS device as described in the above.

In the method for making a MEMS device, preferably, the step of removing the to-be-etched region includes: first etching the to-be-etched region by an anisotropic reactive ion etch, and then etching the to-be-etched region by hydrogen fluoride vapor etch or buffered oxide etch.

In another aspect, the present invention discloses a MEMS device, comprising: a substrate with at least one opening; and a membrane supported on the substrate, the membrane including at least two thin segments and a thick segment connected together, wherein the two thin segments are not at the same level, and the thick segment is formed by a plurality of layers including at least two metal layers and a via layer, such that the membrane has a curve cross section.

Preferably, the membrane and the substrate form a cavity therebetween, and the membrane vibrates to cause a capacitance change.

In one embodiment, the membrane further includes at least one protrusion on its lower surface.

In one embodiment, the MEMS device further comprising a suspended section which includes a part of the substrate and a conductive layer.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

The drawings as referred to throughout the description of the present invention are for illustration only, but not drawn according to actual scale.

Figure 1:
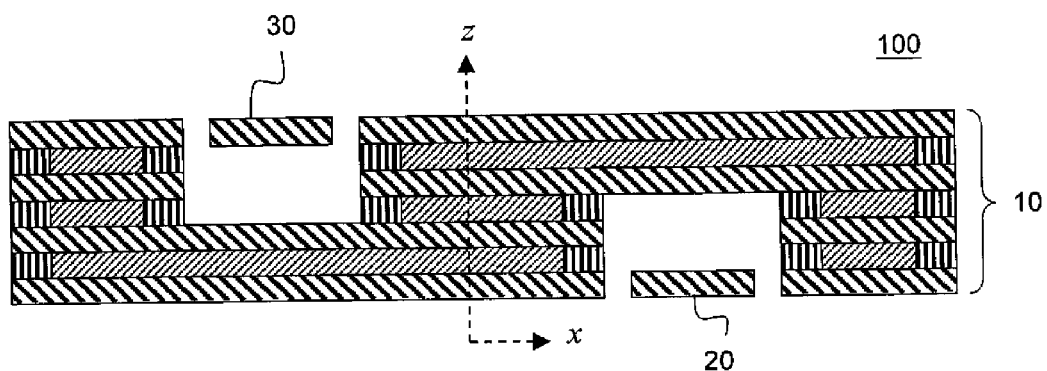
FIG. 1 shows a structure embodiment according to the present invention.

Referring to FIG. 1, in one embodiment of the present invention, the MEMS structure 100 of an out-of-plane sensor includes a mass 10, a lower electrode 20 and an upper electrode 30. In the x-direction of the figure, the lower electrode 20 and the upper electrode 30 are misaligned with respect to each other. One differential capacitor is formed between the mass 10 and the lower electrode 20, and another differential capacitor is formed between the mass 10 and the upper electrode 30. When the mass 10 moves along the z-direction of the figure, the sensitivity of the sensor is double, because the variation of the capacitance is twice of the variation of the vertical distance. For convenience in capacitance calculation, the vertical distance between the mass 10 and the lower electrode 20, and the vertical distance between the mass 10 and the upper electrode 30 should preferably be the same, but not necessarily so. In the latter case, the capacitance calculation should take the difference between the distances into consideration.

Figure 2:
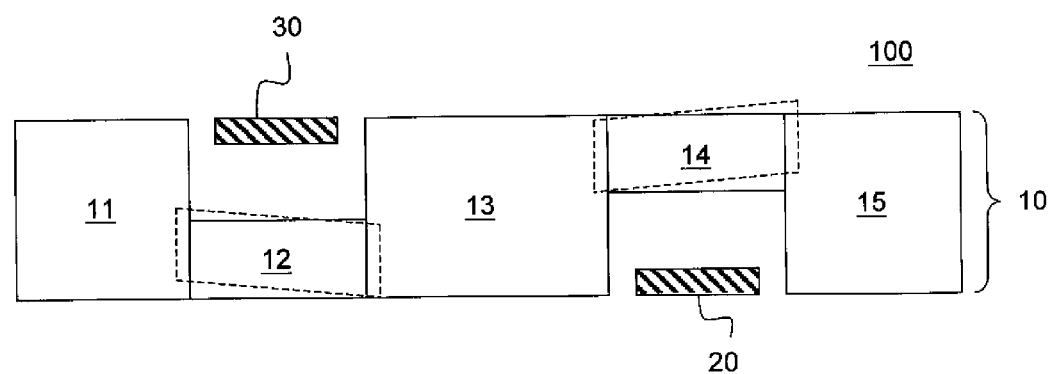
FIG. 2 explains how the present invention reduces the impact of the residual stress.

One merit of the structure as shown is that it can reduce the impact of stress. Referring to FIG. 2, the mass 10 may be divided into five parts, i.e., the main body 13, two outer mass parts 11 and 15, and two structure parts 12 and 14 acting like capacitor plates. The two capacitor plates 12 and 14 are located at different elevation levels (in z-direction), forming two capacitors with the upper and lower electrodes 30 and 20, respectively. If the structure part 12 is only connected with the main body 13, but not with the outer mass part 11, then bending may occur as shown by the dash-line block due to stress generated in the manufacturing process. Likely, if the structure part 14 is only connected with the main body 13, but not with the outer mass part 15, then bending may also occur as shown by the dash-line block. However, although both the structure parts 12 and 14 bend upwardly, their relationships with the corresponding upper and lower electrodes 30 and 20 are changed asymmetrically. In other words, the process may impact the structure, and leads to inaccuracy in capacitance calculation. In the present invention, since there are outer mass parts 11 and 15 provided to connect the outer sides of the structure parts 12 and 14, the likelihood of bending can be greatly reduce. Nevertheless, such outer mass parts 11 and 15 are only preferred, but not necessary to the present invention.

Figure 3:
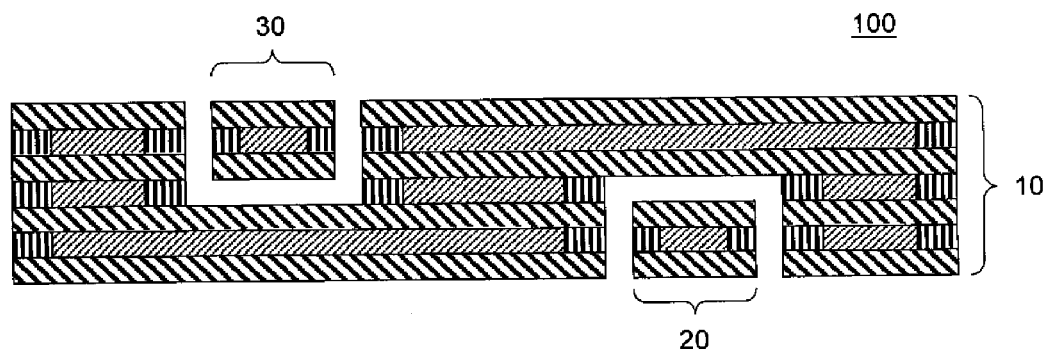
FIGS. 3-5 show several other structure embodiments of the present invention.
Figure 4:
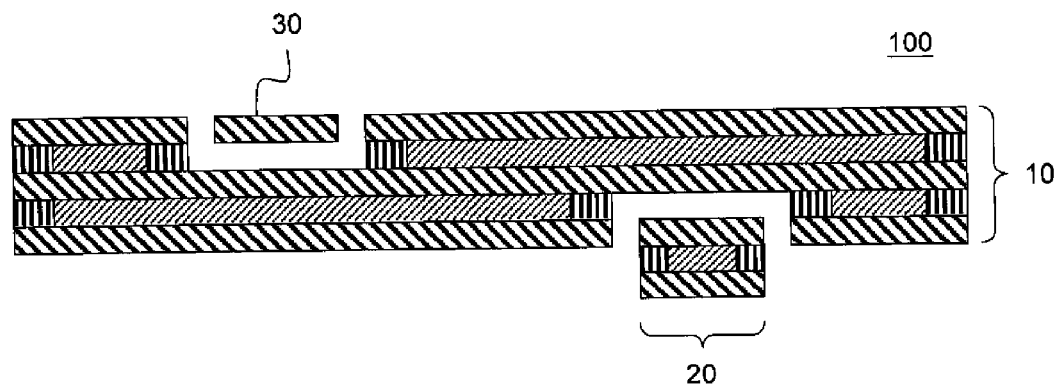
Figure 5:
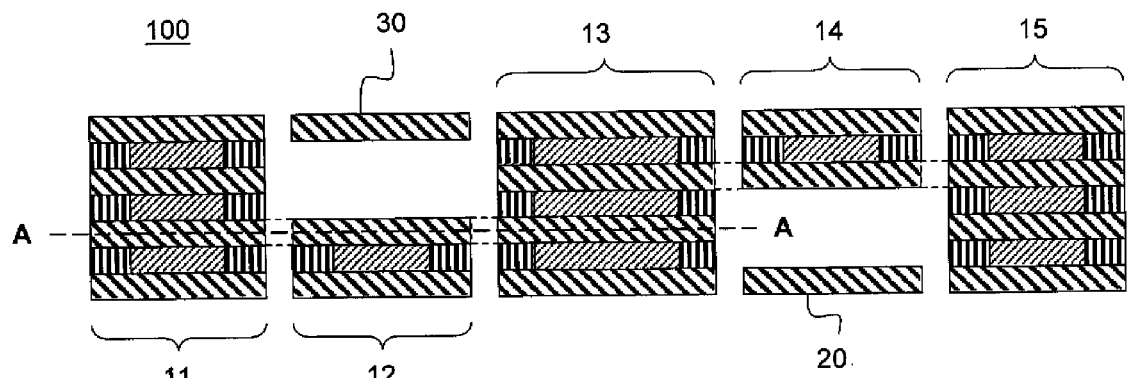
Figure 6:
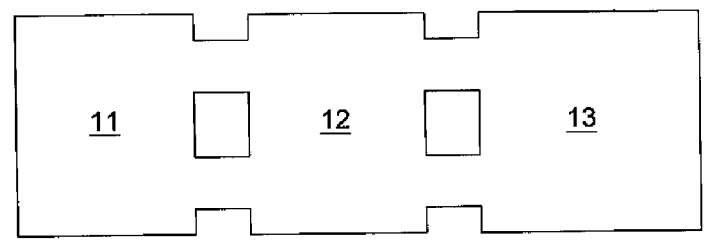
FIG. 6 shows, as an example, how the top view may look like from the A-A section of FIG. 5.

Under the same spirit of the present invention, the structure of FIG. 1 may be modified in various ways, and the number of layers may be different. The key features are that (1) the upper and lower electrodes 30 and 20 are misaligned in x-direction, and (2) at least one side of each of the capacitor plates is connected with a relatively larger mass body; preferably, both sides of the capacitor plates are connected with relatively larger mass bodies. FIGS. 3-5 show several more examples. Note that as shown in FIG. 4, the upper and lower electrodes 30 and 20 do not require to have the same cross sectional structure, because what effectively produce the capacitance are the lower surface of the upper electrode 30, the upper surface of the lower electrode 20, and the distances between the mass 10 and them. Moreover, as shown in FIG. 5, the two capacitor plates 12 and 14 may be connected with the other parts 11, 13 and 15 only at one or several connection points, instead of integrated as a whole body. For example, as shown by the dash lines in FIG. 5, they may be connected with one another in only one of the interconnection layers, from cross-sectional view. The dash lines in FIG. 5 imply that the connection points are not at the same cross section as the rest of the figure. Or, they may be connected with one another only at one or several connection points, from top view. For example, the top view taken from the A-A line of FIG. 5 may be as shown in FIG. 6.

Figure 7:
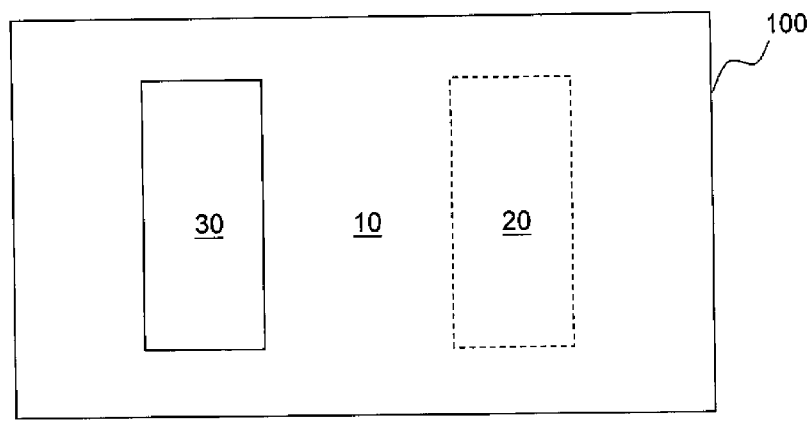
FIG. 7 schematically shows a top view of the MEMS structure unit 100 according to the present invention.
Figure 8:
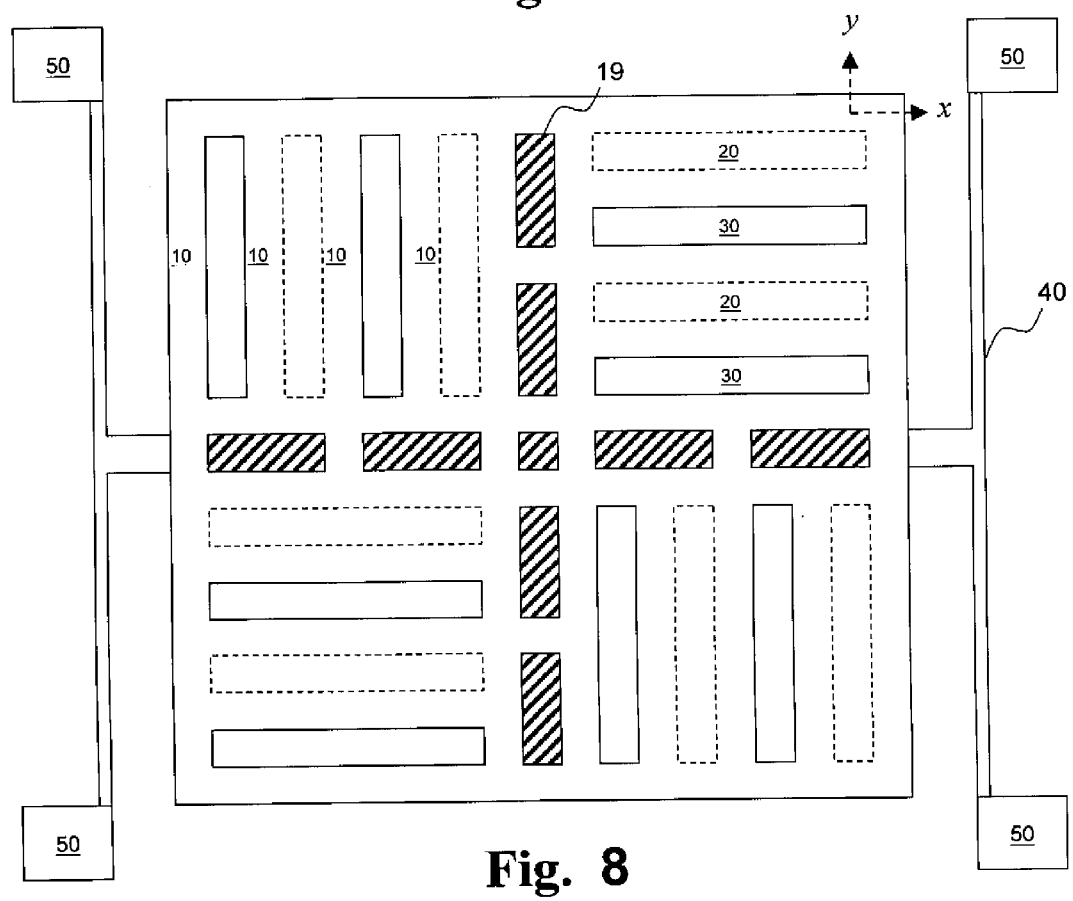
FIGS. 8-10 show three layout embodiments of the present invention.

The MEMS structure 100 shown in FIGS. 1-5 may be taken as one MEMS unit, having a top view as shown in FIG. 7. The lower electrode 20 is shown by dash lines to imply that it is located beneath the mass 10. Multiple such MEMS units may be grouped together, with properly arranged layout, to increase the accuracy of the overall device. FIG. 8 shows an example, wherein multiple MEMS units are arranged by the layout as shown. Note that the upper-right and lower-left MEMS units are rotated 90°, to cancel the imbalance cause by the stress in x and y directions, so that the capacitance measured by the overall device is more accurate. FIG. 8 also shows that the mass 10 includes openings 19. Such openings are provided so that it is easier to etch the material beneath the mass 10, as will be understood more clearly with reference to the manufacturing process to be described later. The mass 10 is connected with anchors 50 via springs 40.

Figure 9:
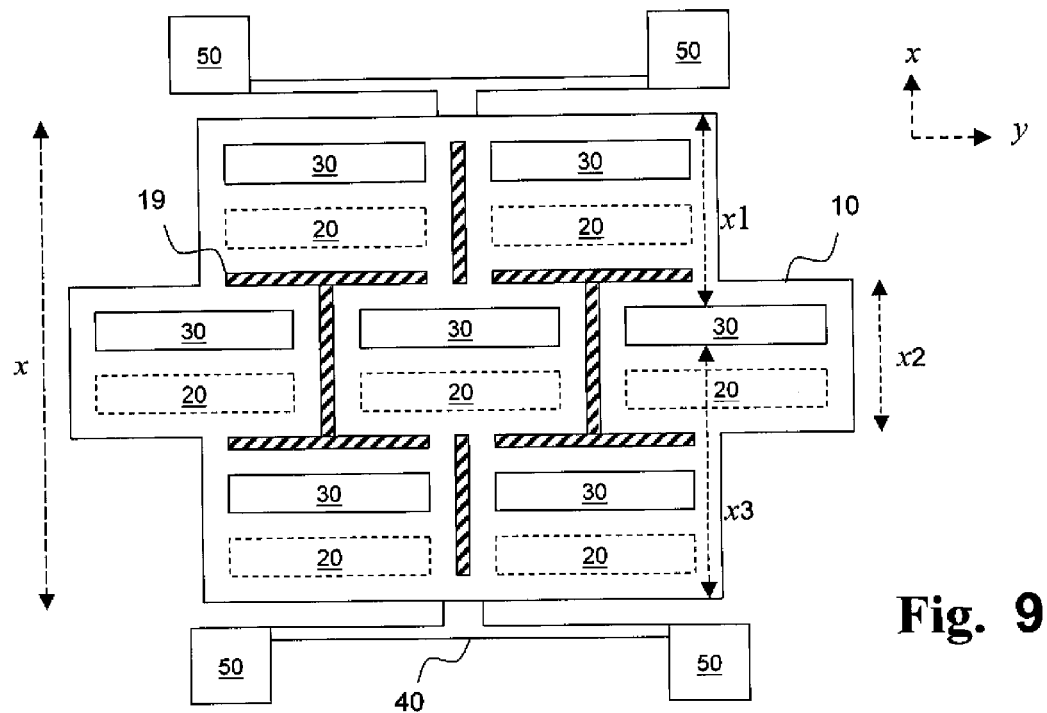
Figure 10:
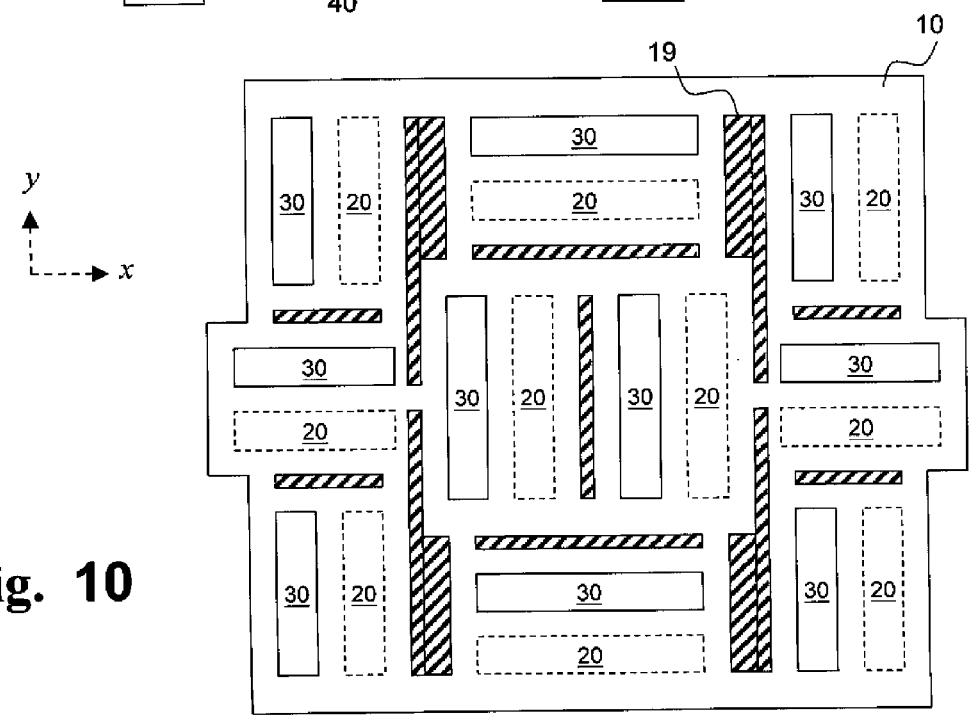

There are many variations of the layouts, other than that shown in FIG. 8. FIGS. 9 and 10 show two more layout embodiments. In the embodiment of FIG. 9, some of the MEMS units are misaligned in at least one of the x and y directions, in x direction in this embodiment (the MEMS units 100 have been rotated 90° as compared with FIG. 7, and therefore to be consistent, we define the x dimension to be the dimension where the upper and lower electrodes 30 and 20 are misaligned with each other). The misalignment of the MEMS units 100 is for the purpose to limit the continuous length of the mass 10 in x, y or both directions (only in x direction in this embodiment). More specifically, as shown in the figure, the maximum length of the mass 10 is no longer x; the x dimension is divided into multiple segments x1, x2 and x3, each being less than a predetermined length, e.g., 60 μm-100 μm. The shortened continuous length in a direction helps to avoid bending in that direction. The length limit is applied only to the x dimension in this embodiment, but it can certainly be applied to the y dimension as well, or both x and y dimensions. Note that the mass 10 in this embodiment also includes openings 19.

FIG. 10 shows a layout embodiment which includes both features of "MEMS unit rotation" and "length limit". The maximum length in y dimension is limited. This embodiment also shows that the MEMS units 10 do not have to be of the same size. The springs and the anchors are not shown in the figure; they may be located upper and lower sides of the mass 10 (in y dimension) or at the left and right sides of the mass 10 (in x dimension)

Hereinafter a manufacturing process according to the present invention will be explained with reference to FIGS.

11-14, taking the structure shown in FIG. 5 for example. A six-metal-layer process is shown as an example, but the present invention can certainly be embodied in a process of any other number of metal layers, for making the structures of FIGS. 1-10 and other structures under the spirit of the present invention.

Figure 11:
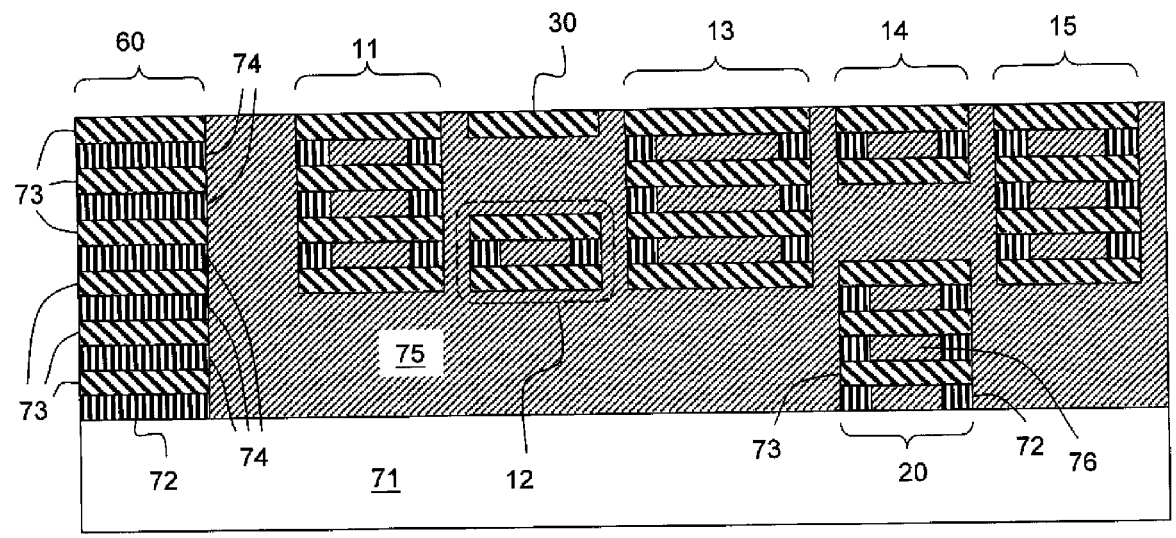
FIGS. 11-14 show a process embodiment of the present invention.

Referring to FIG. 11, in this embodiment, a zero-layer wafer substrate 71 is provided, which for example can be a silicon wafer so that the process is compatible with a standard CMOS process. Next, transistor devices can be formed by standard CMOS process steps as required (not shown), followed by deposition, lithography and etch steps to form interconnection layers including a contact layer 72, metal layers 73, and via layers 74. The patterns of the interconnection layers are such that they form the upper and lower electrodes 30 and 20, and the mass 10 (including the main body 13, the outer mass parts 11 and 15, and the two capacitor plates 12 and 14); and an oxide region 75 (the "to-be-etched region") is concurrently formed in the interconnection layers. In order that the etching of the oxide region 75 does not damage the other areas in the MEMS device, preferably, the oxide region 75 is encompassed in a guard ring 60. The guard ring can be formed concurrently with the patterns of the layers 72, 73 and 74.

In the structure as shown, for example, the metal layers can be made of aluminum; the contact layer and the via layers can be made of tungsten; and the oxide region 75 may be made of silicon oxide. The mass 10 and the lower electrode 20 may be completely made by tungsten, or made by oxide 76 enclosed by surrounding tungsten, as shown in the figure. Of course, the latter costs lower.

Figure 12:
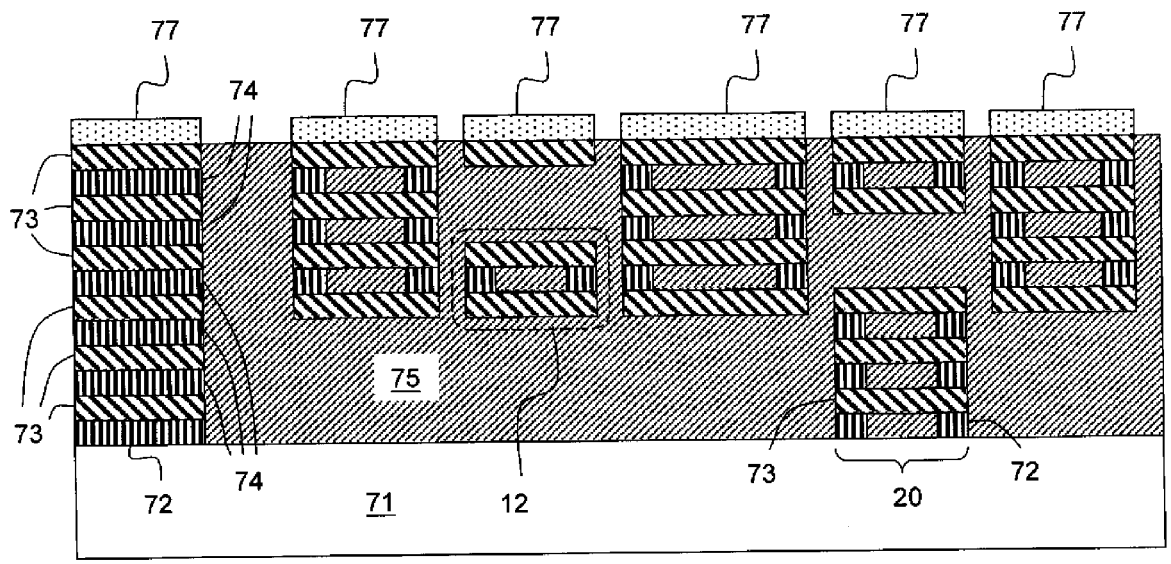

Referring to FIG. 12, a mask 77 is formed and patterned to expose the oxide region 75. The mask 77 for example can be a photoresist layer patterned by lithography, or other materials such as a metal layer or an amorphous silicon layer.

Figure 13:
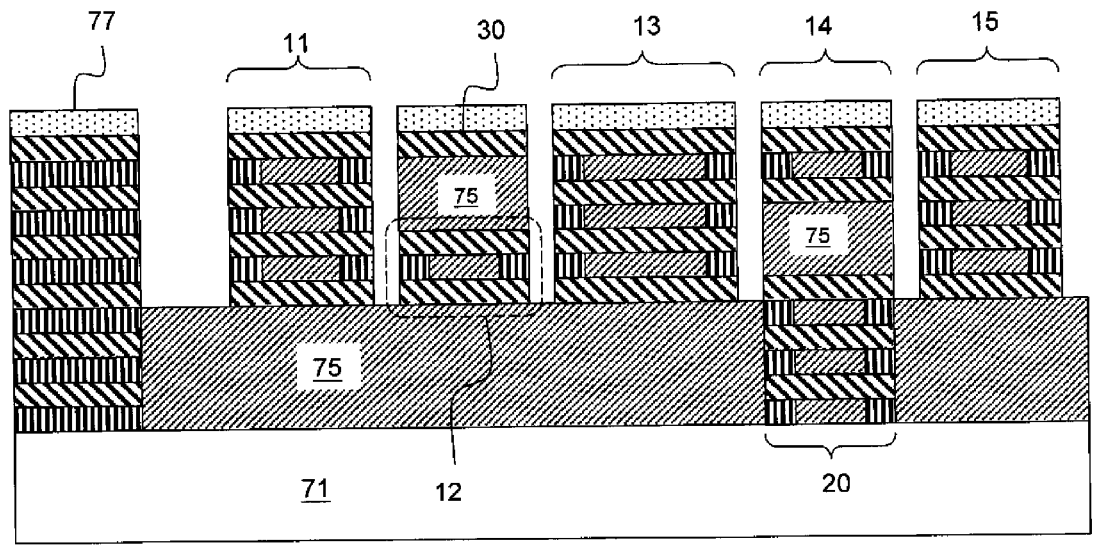

Referring to FIG. 13, an oxide etch step is performed according to the pattern of the mask 77, to remove the oxide inside the narrow portions of the oxide region 75. The etch for example can be anisotropic RIE (reactive ion etch).

Figure 14:
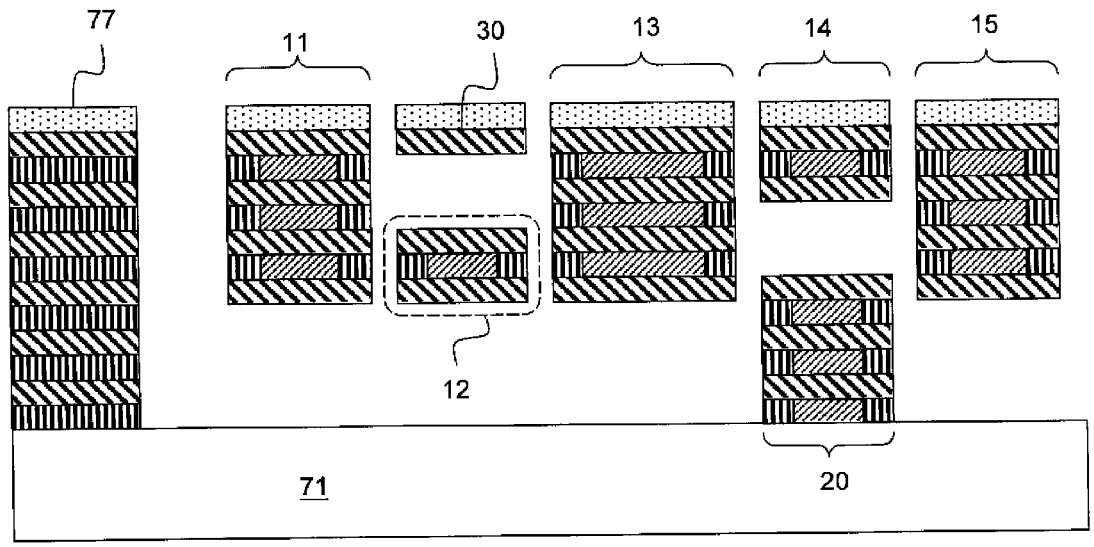

Next referring to FIG. 14, another etch step is performed on the oxide region 75 to remove it. The etch for example can be HF (hydrogen fluoride) vapor etch, or BOE (buffered oxide etch) by immersing the whole wafer in an acid tank.

Finally, if the mask 77 is a photoresist layer, it can be removed; or, if the mask 77 is a layer of some other material, it can be kept or removed as desired. A desired MEMS device is thus obtained.

Figure 15:
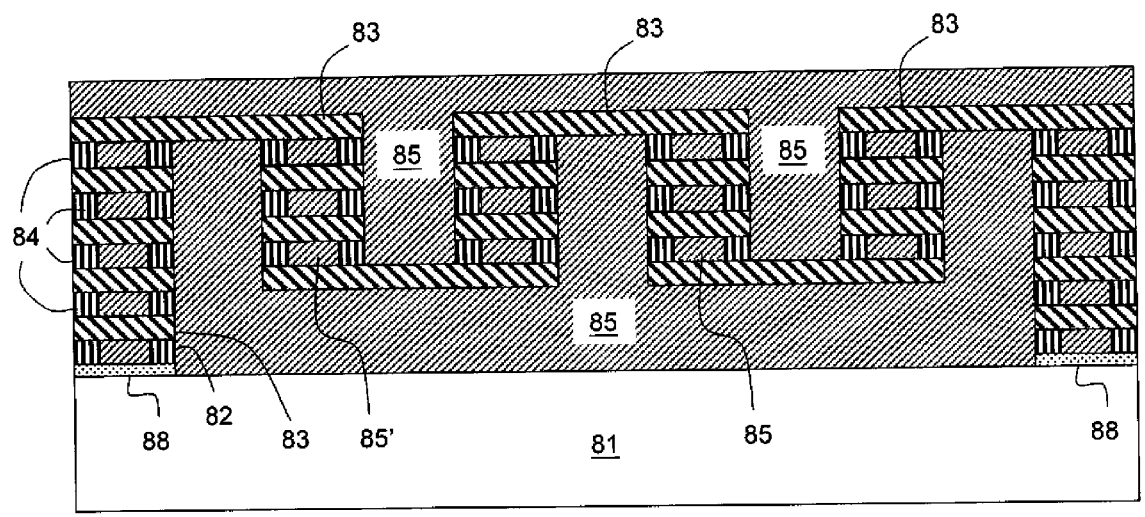
FIGS. 15-17 show another process embodiment of the present invention for making a MEMS device.
Figure 16:
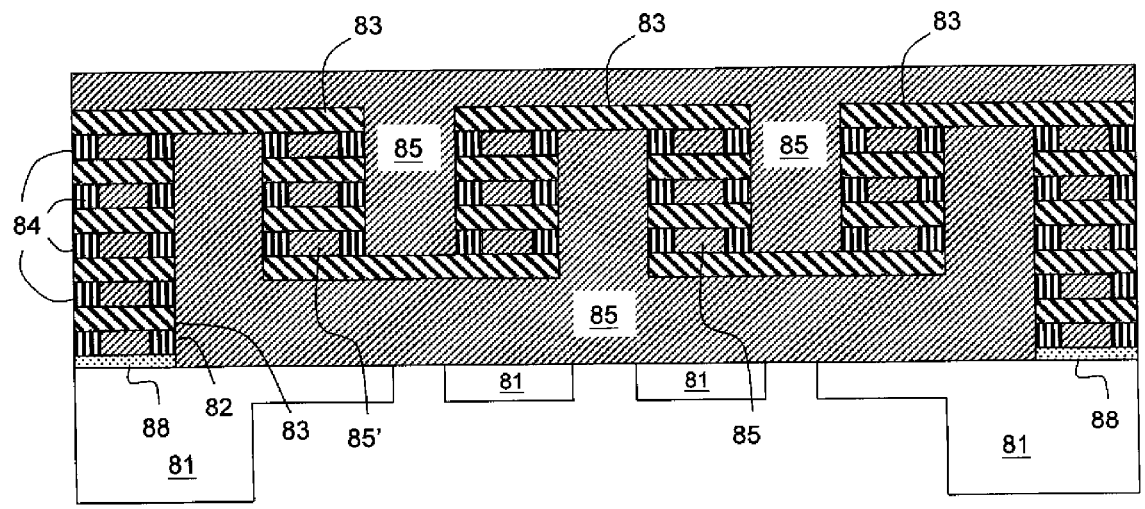
Figure 17:
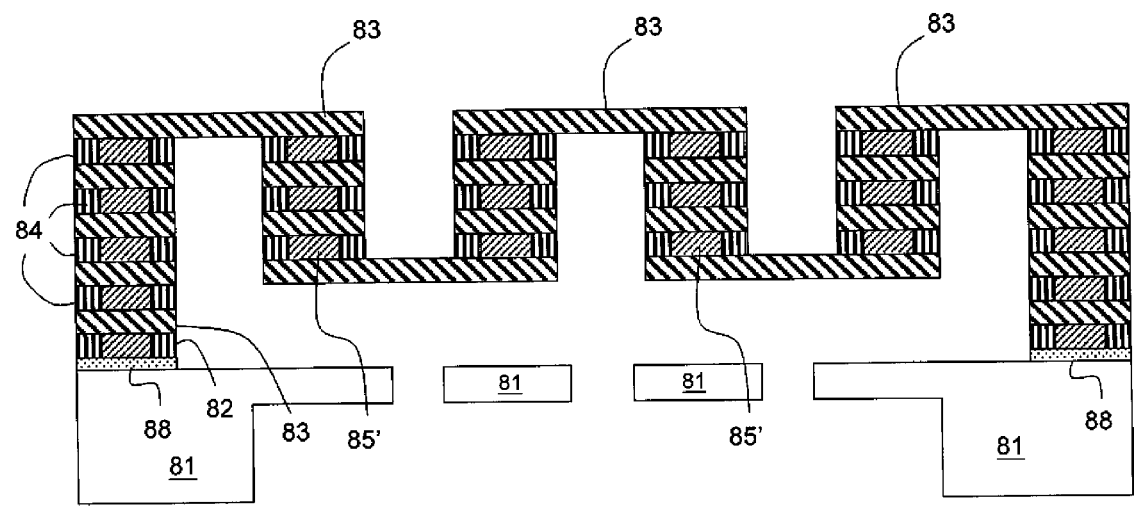
Figure 18:
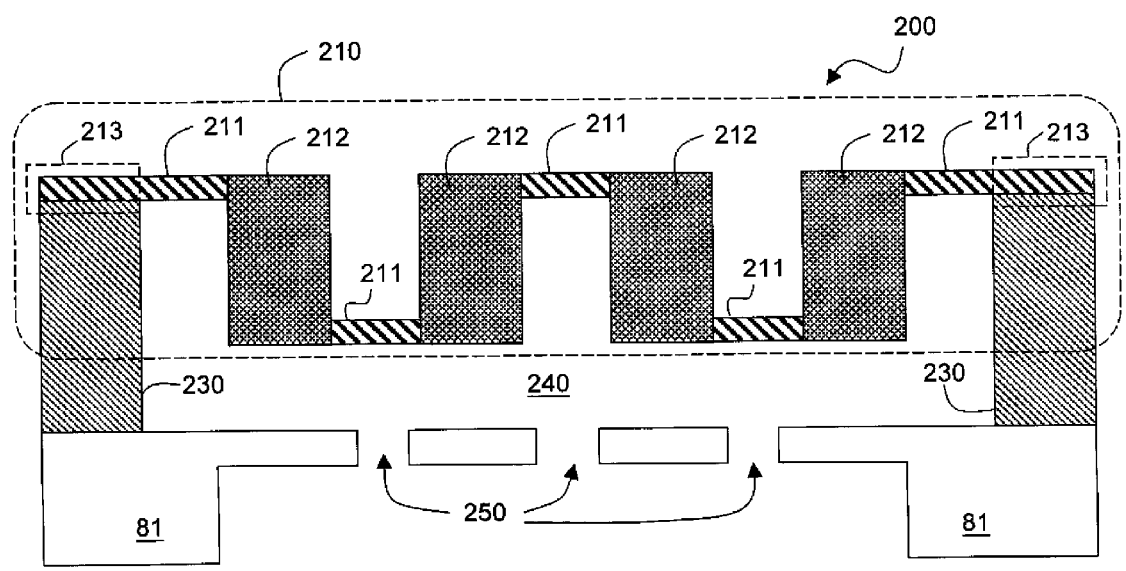
FIG. 18 explains the structure according to the present invention.

The spirit of the present invention is not only applicable to out-of-plane sensor but also applicable to other types of MEMS devices, such as ones which do not require a differential capacitor. FIGS. 15-17 show another process embodiment of the present invention which for example may be used for making a micro-acoustical sensor. FIG. 18 shows the MEMS device made by the process of FIGS. 15-17.

Referring first to FIG. 18, the MEMS device 200 includes a membrane 210, which is supported on a substrate 81 by anchors 230. The membrane 210 includes thin segments 211 and thick segments 212; the thin segments 211 are connected to the anchors 230 byconnectingparts 213. The connecting-parts 213 may simply be in the form of a thin membrane, or in the form of a spring such as the one shown in FIGS. 8-10 (the spring 40). The membrane 210 and the substrate 81 form a capacitor with a cavity 240 therebetween; the vibration of the membrane 210 causes changes of the capacitance. The substrate 81 includes openings (vents) 250 to release the pressure caused by the vibration of the membrane 210.

As shown in the figure, the membrane 210 made of thin and thick segments has a curve cross section. More specifically, the membrane 210 includes at least two thin segments 211 and a thick segment 212 connected together, wherein the two thin segments 211 are not at the same level. Thus, the membrane 210 has a curve cross section. This curve cross section reduces the maximum continuous area of the membrane 210, and helps to reduce the impact of the stress caused by the manufacturing process.

The structure of FIG. 18 for example may be made by the process of FIGS. 15-17. In FIG. 15, a substrate 81 is provided, which for example can be a silicon wafer so that the process is compatible with a standard CMOS process. An insulating layer 88 is formed on the substrate 81, preferably with a material different from the material of the to-be-etched region 85. The material for the layer 88 for example can be silicon nitride, silicon oxynitride, or undoped poly-silicon. Next, a contact layer 82, metal layers 83, and via layers 84 are formed; the patterns of these layers are such that they form the membrane 210. More specifically, the thick segment 212 (FIG. 18) is formed by a plurality of layers including at least two metal layers 83 and a via layer 84. The thin segment is formed by one metal layer 83. The anchors 213 are also made concurrently, each of which includes the insulating layer 88, the contact layer 82 on the insulating layer 88, and metal and via layers 83 and 84. An oxide region, which is the to-be-etched region 85 is also formed. The internal part of the thick segments 212 and the anchors 213 may also contain oxide 85', but such oxide regions 85' are not to be removed. In the structure as shown, for example, the metal layers can be made of aluminum; the contact layer and the via layers can be made of tungsten; and the oxide region 75 may be made of silicon oxide.

Referring to FIG. 16, the substrate 81 is etched, for example by two lithography and etch processes, to form the openings in the substrate 81. Next in FIG. 17, the oxide 85 is removed so that the membrane 210 becomes movable. Thus, a desired MEMS device is obtained.

Figure 19:
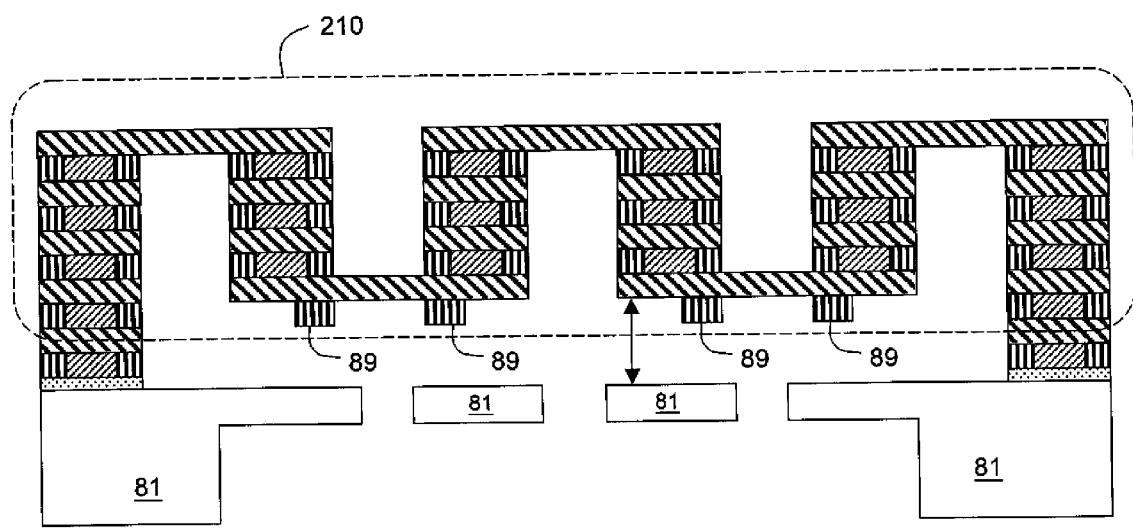
FIG. 19 shows another embodiment of the present invention.

In addition to the above, referring to FIG. 19, the membrane 210 may be further provided with one or more protrusions 89 on its lower surface. The protrusion 89 reduces the possible contact area between the membrane 210 and the substrate 81 when the membrane 210 vibrates, and reduces the surface tension effect, so that the MEMS device less likely malfunctions.

Figure 20:
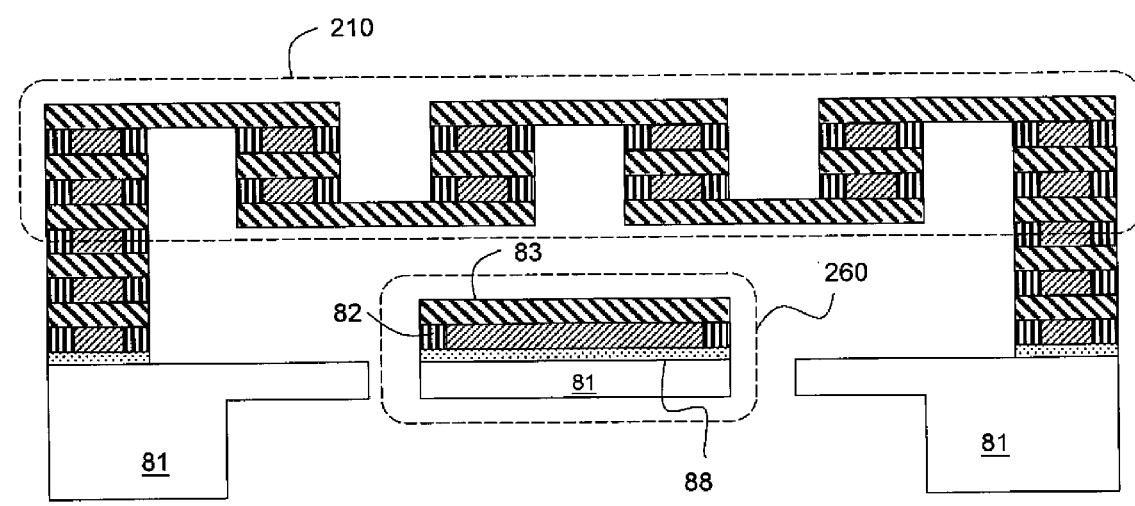
FIG. 20 shows another embodiment of the present invention.

The present invention can be applied to other forms of micro-acoustical MEMS devices. Referring to FIG. 20, in this embodiment, the MEMS device includes a suspended section 260. The suspended section 260 includes a part of the substrate 81 and a conductive layer such as one metal layers 83, so that it can vibrate and it forms a capacitor with the membrane 210. It is not necessary for the suspended section 260 to further include the insulating layer 88 and the contact layer 82, but they are included for process simplicity. In this embodiment, it is not the membrane 210 but the suspended section 260 that vibrates to cause capacitance change.

Although the present invention has been described in detail with reference to certain preferred embodiments thereof, the description is for illustrative purpose and not for limiting the scope of the invention. For example, the thin segment 211 may be formed by more than one layer. As another example, the aluminum (for metal layers), tungsten (for contact and via layers) and silicon dioxide (for the to-be-etched region) maybe replaced by copper and low dielectric constant materials. One skilled in this art can readily think of other modifications and variations in light of the teaching by the present invention. In view of the foregoing, it is intended that the

What is claimed is:

1. A MEMS device, comprising:
   a substrate with at least one opening; and
   a membrane supported on the substrate, the membrane including at least two thin segments and a thick segment connected together, wherein the two thin segments are not at the same level, and the thick segment is formed by a plurality of layers including at least two metal layers and a via layer, such that the membrane has a curve cross section.

2. The MEMS device of claim 1, wherein the membrane and the substrate form a cavity therebetween.

3. The MEMS device of claim 2, wherein the membrane vibrates to cause a capacitance change.

4. The MEMS device of claim 2, wherein the thin segment is formed by a metal layer.

5. The MEMS device of claim 1, further comprising anchors supporting the membrane on the substrate, each anchor including an insulating layer, a contact layer on the insulating layer, a first metal layer on the contact layer, a via layer on the first metal layer, and a second metal layer on the via layer.

6. The MEMS device of claim 1, wherein the MEMS device is a micro-acoustical sensor.

7. The MEMS device of claim 1, wherein the membrane further includes at least one protrusion on its lower surface.

8. The MEMS device of claim 1, further comprising a suspended section which includes a part of the substrate and a conductive layer.

9. The MEMS device of claim 8, wherein the suspended section vibrates to cause a capacitance change.

* * * * *